US012033675B2

(12) United States Patent
Okamura et al.

(10) Patent No.: US 12,033,675 B2
(45) Date of Patent: Jul. 9, 2024

(54) COBALT-BORON (CoB) LAYER FOR MAGNETIC RECORDING DEVICES, MEMORY DEVICES, AND STORAGE DEVICES

(71) Applicant: Western Digital Technologies, Inc., San Jose, CA (US)

(72) Inventors: Susumu Okamura, San Jose, CA (US); Quang Le, San Jose, CA (US); Brian R. York, San Jose, CA (US); Cherngye Hwang, San Jose, CA (US); Randy G. Simmons, San Jose, CA (US); Kuok San Ho, Emerald Hills, CA (US); Hisashi Takano, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/956,786

(22) Filed: Sep. 29, 2022

(65) Prior Publication Data

US 2024/0112840 A1    Apr. 4, 2024

(51) Int. Cl.
| | |
|---|---|
| *G11B 5/31* | (2006.01) |
| *G11B 5/235* | (2006.01) |
| *G11B 5/37* | (2006.01) |
| *H01F 10/32* | (2006.01) |
| *H10B 61/00* | (2023.01) |
| *H10N 50/85* | (2023.01) |
| *H10N 52/00* | (2023.01) |
| *H10N 52/80* | (2023.01) |

(Continued)

(52) U.S. Cl.
CPC ............ *G11B 5/3146* (2013.01); *G11B 5/235* (2013.01); *G11B 5/3133* (2013.01); *G11B 5/314* (2013.01); *G11B 5/37* (2013.01); *H01F 10/329* (2013.01); *H10B 61/00* (2023.02); *H10N 50/85* (2023.02); *H10N 52/00* (2023.02); *H10N 52/80* (2023.02); *C22C 19/07* (2013.01); *G11B 2005/0024* (2013.01); *G11B 5/39* (2013.01)

(58) Field of Classification Search
None
See application file for complete search history.

(56) References Cited

U.S. PATENT DOCUMENTS 9,177,575 B1 * 11/2015 Gao et al. ............ G11B 5/3909
11,283,006 B1    3/2022 Freitag et al.
(Continued)

*Primary Examiner* — Craig A. Renner
(74) *Attorney, Agent, or Firm* — PATTERSON + SHERIDAN, LLP

(57) ABSTRACT

Embodiments of the present disclosure relate to a cobalt-boron (CoB) layer for magnetic recording devices, memory devices, and storage devices. In one or more embodiments, the CoB layer is part of a spin-orbit torque (SOT) device. In one or more embodiments, the SOT device is part of an SOT based sensor, an SOT based writer, a memory device (such as a magnetoresistive random-access memory (MRAM) device), and/or a storage device (such as a hard disk drive (HDD) or a tape drive). In one embodiment, an SOT device includes a seed layer, and a cap layer spaced from the seed layer. The SOT device includes a spin-orbit torque (SOT) layer, and a nano layer (NL) between the seed layer and the cap layer. The SOT device includes a cobalt-boron (CoB) layer between the seed layer and the cap layer, and the CoB layer is ferromagnetic.

20 Claims, 11 Drawing Sheets

(51) Int. Cl.
C22C 19/07 (2006.01)
G11B 5/00 (2006.01)
G11B 5/39 (2006.01)

(56) References Cited

U.S. PATENT DOCUMENTS

2008/0198514 A1 8/2008 Jogo et al.
2020/0006625 A1 1/2020 Oguz et al.
2021/0336127 A1 10/2021 Le et al.
2022/0013138 A1 1/2022 Hwang et al.

* cited by examiner

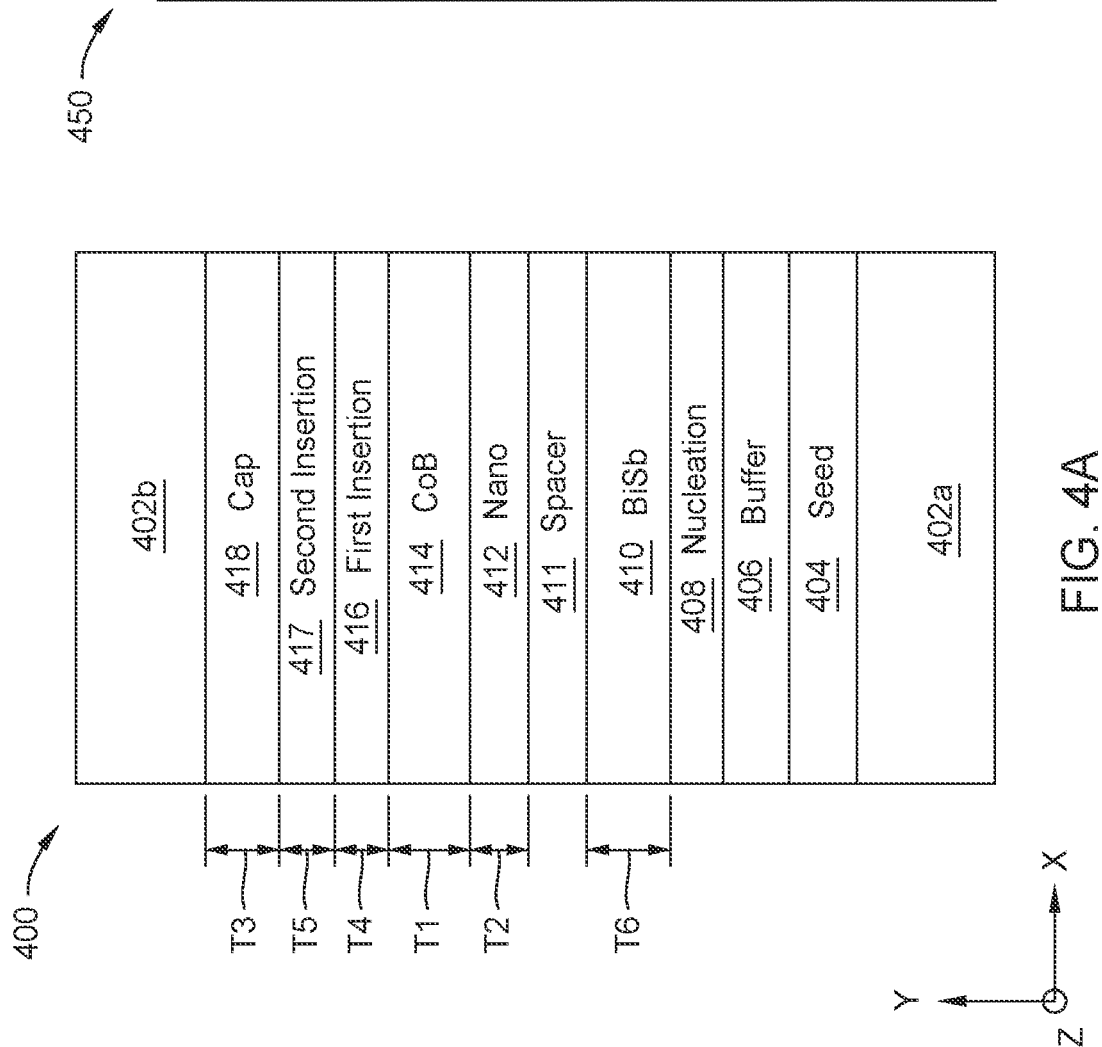

COBALT-BORON (CoB) LAYER FOR MAGNETIC RECORDING DEVICES, MEMORY DEVICES, AND STORAGE DEVICES

BACKGROUND OF THE DISCLOSURE

Field of the Disclosure

Embodiments of the present disclosure relate to a cobalt-boron (CoB) layer for magnetic recording devices, memory devices, and storage devices.

Description of the Related Art

In spin-orbit torque (SOT) devices, it can be desirable to have the properties of negative magnetostriction ($\lambda$), low coercivity ($H_c$), and high resistivity. However, many configurations have limitations with respect to such properties. Many configurations can also involve hindrances with respect to material melting, material migration, material damage, and large grain sizes.

Therefore, there is a need for improved material configurations, such as for SOT devices.

SUMMARY OF THE DISCLOSURE

Embodiments of the present disclosure relate to a cobalt-boron (CoB) layer for magnetic recording devices, memory devices, and storage devices. In one or more embodiments, the CoB layer is part of a spin-orbit torque (SOT) device. In one or more embodiments, the SOT device is part of an SOT based sensor, an SOT based writer, a memory device (such as a magnetoresistive random-access memory (MRAM) device), and/or a storage device (such as a hard disk drive (HDD) or a tape drive).

In one embodiment, a spin-orbit torque (SOT) device includes a seed layer, and a cap layer spaced from the seed layer. The cap layer is nonmagnetic. The SOT device includes a spin-orbit torque (SOT) layer, and a nano layer (NL) between the seed layer and the cap layer. The NL is magnetic. The SOT device includes a cobalt-boron (CoB) layer between the seed layer and the cap layer, and the CoB layer is ferromagnetic. The CoB layer is substantially free from materials other than cobalt (Co) and boron (B).

The NL is under the CoB layer and has a polarization that is higher than the CoB layer which can increase the polarization of (e.g., polarize) the CoB free layer (FL) layer and enhance negative magnetostrictive properties of the CoB layer.

In one embodiment, a spin-orbit torque (SOT) device includes a spin-orbit torque (SOT) layer that includes bismuth antimony (BiSb), and a cobalt-boron (CoB) layer. The CoB layer is ferromagnetic. The SOT device includes a nano layer (NL) between the SOT layer and the CoB layer. The NL is magnetic. The SOT device includes one or more insertion layers above the CoB layer such that the CoB layer is between the NL and the one or more insertion layers.

In one embodiment, a spin-orbit torque (SOT) device includes a seed layer, and a cap layer spaced from the seed layer. The cap layer is nonmagnetic. The SOT device includes a polarizing means between the seed layer and the cap layer. The polarizing means is magnetic. The SOT device includes a cobalt-boron (CoB) layer between the polarizing means and the cap layer, and the CoB layer is ferromagnetic. The SOT device includes one or more insertion layers between the CoB layer and the cap layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A and 4B are schematic side views of top spin-orbit torque (SOT) devices, according to one or more implementations.

To facilitate understanding, identical reference numerals have been used, where possible, to designate identical elements that are common to the Figures. It is contemplated that elements disclosed in one embodiment may be beneficially utilized on other embodiments without specific recitation.

DETAILED DESCRIPTION

Figure 1:
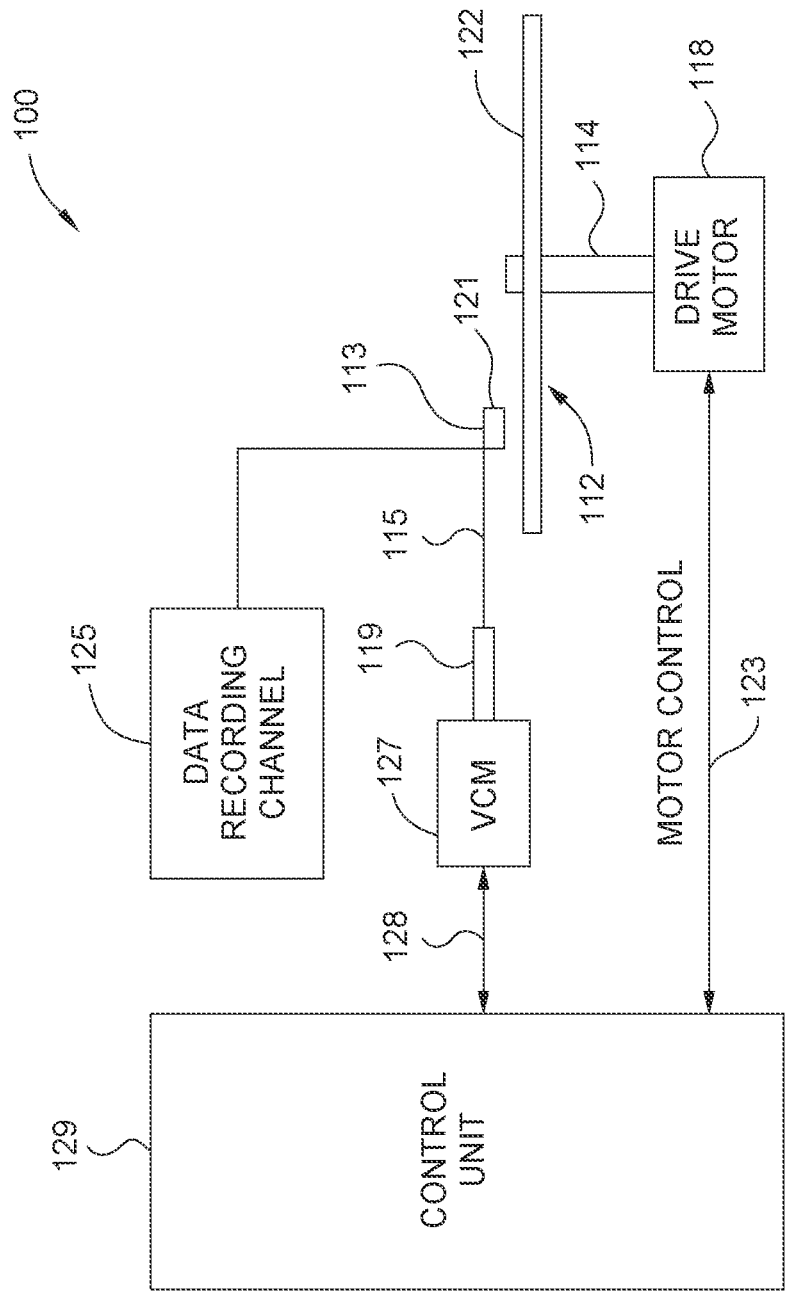
FIG. 1 is a schematic view of a magnetic recording device including a magnetic recording head that has an SOT device, according to one implementation.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure relate to a cobalt-boron (CoB) layer for magnetic recording devices, memory devices, and storage devices. In one or more embodiments, the CoB layer is part of a spin-orbit torque (SOT) device. In one or more embodiments, the SOT device is part of an SOT based sensor, an SOT based reader or writer, a memory device (such as a magnetoresistive random-access memory (MRAM) device), and/or a storage device (such as a hard disk drive (HDD) or a tape drive). In one embodiment, an SOT device includes a seed layer, and a cap layer spaced from the seed layer. The cap layer is nonmagnetic. The SOT device includes a nano layer (NL) between the seed layer and the cap layer, and the NL is magnetic. The SOT device includes a cobalt-boron (CoB) layer between the NL and the cap layer, and the CoB layer is ferromagnetic. The CoB layer facilitates negative magnetostriction (A), low coercivity ($H_c$), and high resistivity. The CoB layer facilitates benefits such as enhanced recording performance, high signal-to-noise ratios, and/or reduced shunting.

The CoB layer can be part of an SOT device that includes a bismuth antimony (BiSb) layer (which can be used as a spin Hall layer). The SOT device can include a nonmagnetic buffer layer, a nonmagnetic interlayer, and a nonmagnetic barrier layer. As an example, a BiSb layer having a (012) orientation or a (001) orientation can form an SOT device. For example, the SOT device can be part of a write head (for example, in a MAMR HDD) or a read head. As another example, the SOT device can be used in nano oscillator devices for reading head applications where a signal is detected in the frequency domain. As another example, the SOT device can be used as part of an MRAM device (e.g., with the BiSb layer used as a spin Hall electrode layer). The SOT device can be in a perpendicular stack configuration or an in-plane stack configuration.

As such, the SOT device can be used in, for example, a MAMR writing head, a read head, a nano-oscillator based reader, an MRAM, an artificial intelligence chip, and/or in other applications.

Unless specified otherwise, the chemicals referred to herein can have any number of atoms for the elements included (e.g., stoichiometric or non-stoichiometric).

FIG. 1 is a schematic view of a magnetic recording device 100 including a magnetic recording head that has an SOT device, according to one implementation. Such a magnetic recording device may be a single drive or include multiple drives. In the implementation shown in FIG. 1, the magnetic recording device 100 is a magnetic media drive, such as hard disk drive (HDD). For the sake of illustration, a single disk drive 100 is shown. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks on the magnetic disk 112. The recording can also be in the form of any suitable patterns of servo tracks.

Figure 2:
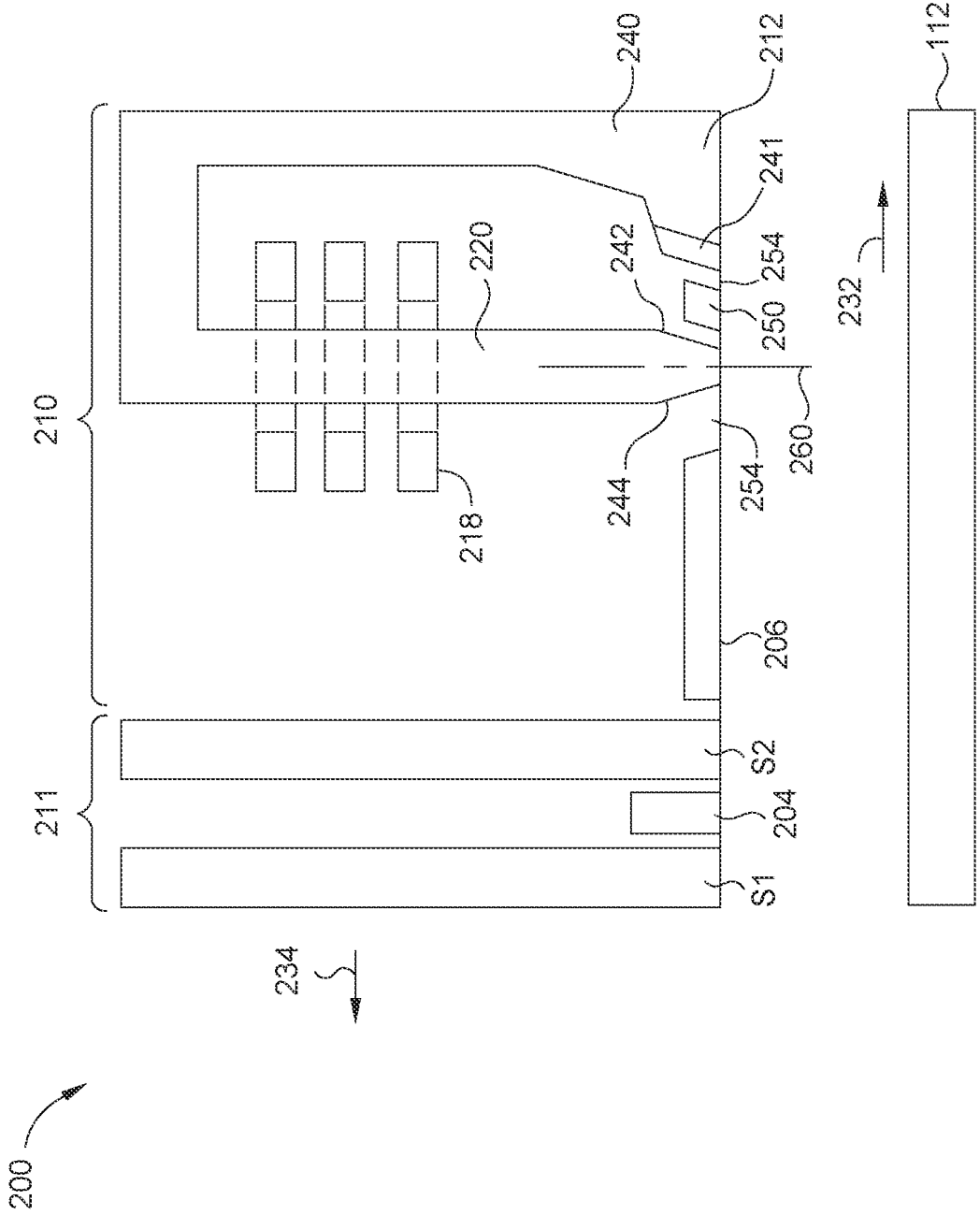
FIG. 2 is a schematic fragmented, cross-sectional side view of a read/write head having an SOT device, according to one implementation.

At least one slider 113 is positioned near the magnetic disk 112, and each slider 113 supports one or more magnetic head assemblies 121 that include an SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 2 may be a voice coil motor (VCM). The VCM includes a coil movable within a fixed magnetic field, the direction and speed of the coil movements being controlled by the motor current signals supplied by a control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by the control unit 129, such as access control signals and internal clock signals. The control unit 129 can include logic control circuits, storage means, and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a magnetic recording device and the accompanying illustration of FIG. 1 are for representation purposes only. It should be apparent that magnetic recording devices may contain a large number of media, or disks, and actuators, and each actuator may support a number of sliders. It is to be understood that the embodiments discussed herein are applicable to a data storage device such as a hard disk drive (HDD) as well as a tape drive, such as a tape embedded drive (TED) or an insertable tape media drive, for example those conforming to the LTO (Linear Tape Open) standards. An example TED is described in the patent application titled "Tape Embedded Drive," U.S. application Ser. No. 16/365,034, filed Mar. 26, 2019, assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least all of HDD, tape drive, and other magnetic recording devices unless HDD or tape drive devices are explicitly claimed.

FIG. 2 is a schematic fragmented, cross-sectional side view of a read/write head 200 having an SOT device, according to one implementation. It is noted that while an SOT device is shown in both the read head and write head, this is for illustrative purposes, and an SOT device may be independently integrated into either only the read head or only the write head in various implementations, or in both the read head and the write head. The read/write head 200 faces a magnetic media 112. The read/write head 200 may be used as the magnetic head assembly 121 shown and described in FIG. 1. The read/write head 200 includes a media facing surface (MFS) 212, such as a gas bearing surface (for example an air bearing surface (ABS)), facing the disk 112, a write head 210, and a magnetic read head 211. As shown in FIG. 2, the magnetic media 112 moves past the write head 210 in the direction indicated by arrow 232 and the read/write head 200 moves in the direction indicated by arrow 234.

In one or more embodiments, the magnetic read head 211 is an SOT read head that includes an SOT sensing element 204 located between SOT shields S1 and S2. The magnetic fields of the adjacent magnetized regions in the magnetic disk 112 are detectable by the SOT sensing element 204 as the recorded bits. In SOT sensing elements 204 that include a BiSb layer, such as the SOT devices described in FIGS. 4A, 4B, and 5, current flows perpendicular to the film plane, and the signal is read out by measuring the voltage in the BiSb layer generated by the inverse spin Hall effect. The SOT device of various implementations can be incorporated into the read head 211.

The write head 210 includes a main pole 220, a leading shield 206, a trailing shield 240, and a coil 218 that excites the main pole 220. The coil 218 may have a "pancake" structure which winds around a back-contact between the main pole 220 and the trailing shield 240, instead of a "helical" structure shown in FIG. 2. In one or more embodiments, the write head 210 is a perpendicular magnetic recording (PMR) write head. In one or more embodiments, the write head 210 may use energy assisted magnetic recording (EAMR) technologies such as microwave assisted magnetic recording (MAMR) and heat assisted magnetic recording (HAMR).

In FIG. 2, a spin-orbital torque (SOT) device 250 is shown as part of the write head structure to facilitate a MAMR recording effect, in one or more embodiments. As noted above, while an SOT device is shown in FIG. 2 for both the read head and the write head, the SOT devices are not necessarily needed to be implemented in both. The SOT device 250 is formed in a gap 254 between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In one or more embodiments, the main pole 220 does not include the trailing taper 242 and the leading taper 244. Instead, the main pole 220 can include a trailing side and a leading side, and the trailing side and the leading side can be substantially parallel. The main pole 220 may be a magnetic material, such as an FeCo alloy. The leading shield 206 and the trailing shield 240 may be a magnetic material, such as a NiFe alloy. In one or more embodiments, the trailing shield 240 can include a trailing shield hot seed layer 241. The trailing shield hot seed layer 241 can include a high moment sputter material, such as CoFe, CoFeNi, or FeXN, where X includes at least one of Rh, Al, Ta, Zr, Co, and Ti. In certain embodiments, the trailing shield 240 does not include a trailing shield hot seed layer.

In one or more embodiments, the read head 211 is a spin torque oscillator (STO) read head with an STO oscillator sensing element 204 located between shields S1 and S2. The magnetic fields of the adjacent magnetized regions of the magnetic disk 112 are detectable by the STO sensing element 204 as the recorded bits. The STO sensing element 204 includes a BiSb layer, such as an SOT device of FIGS. 4A, 4B, and 5. The STO reader may be operated in a 2-terminal or a 3-terminal configuration, with an in-plane current flowing inside an SOT structure while a small sensing current flows perpendicular to the film plane, and the signal is read out by measuring the frequency of magnetic layer precession. The SOT device of various embodiments can be incorporated into the read head 211.

Figure 3A:
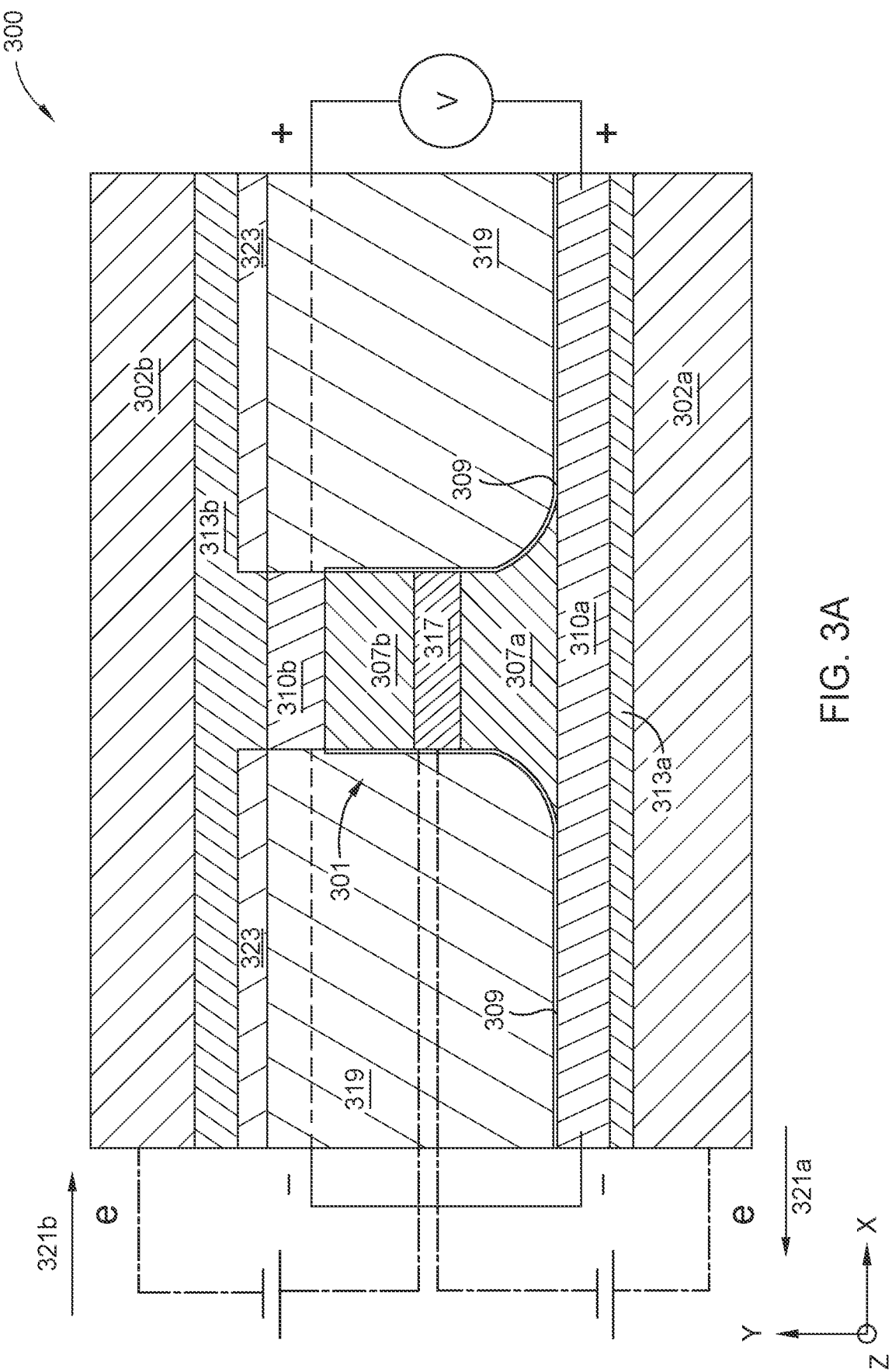
FIGS. 3A-3C are schematic MFS views of read heads, respectively, that include an SOT device, according to one or more implementations.
Figure 3B:
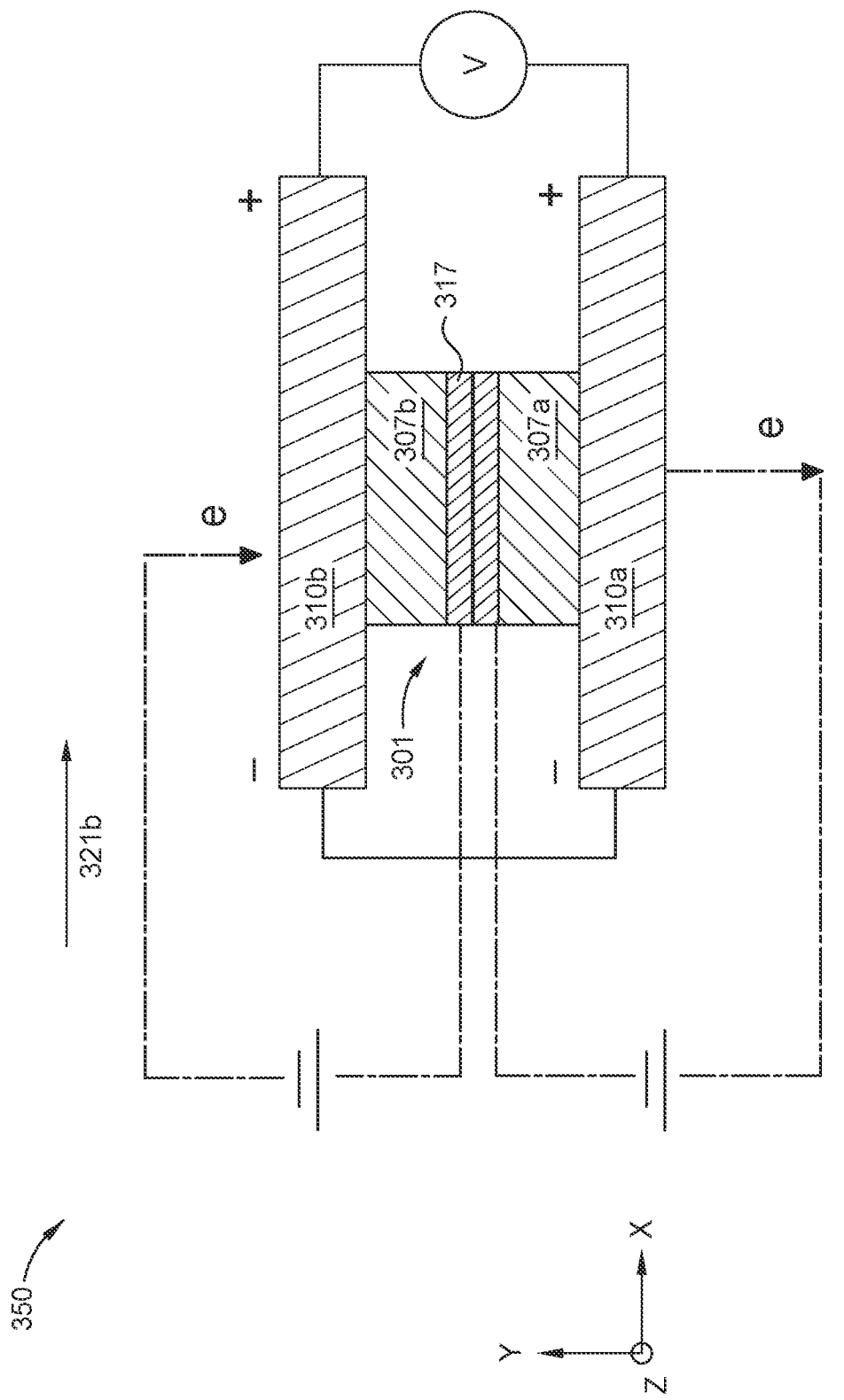
Figure 3C:
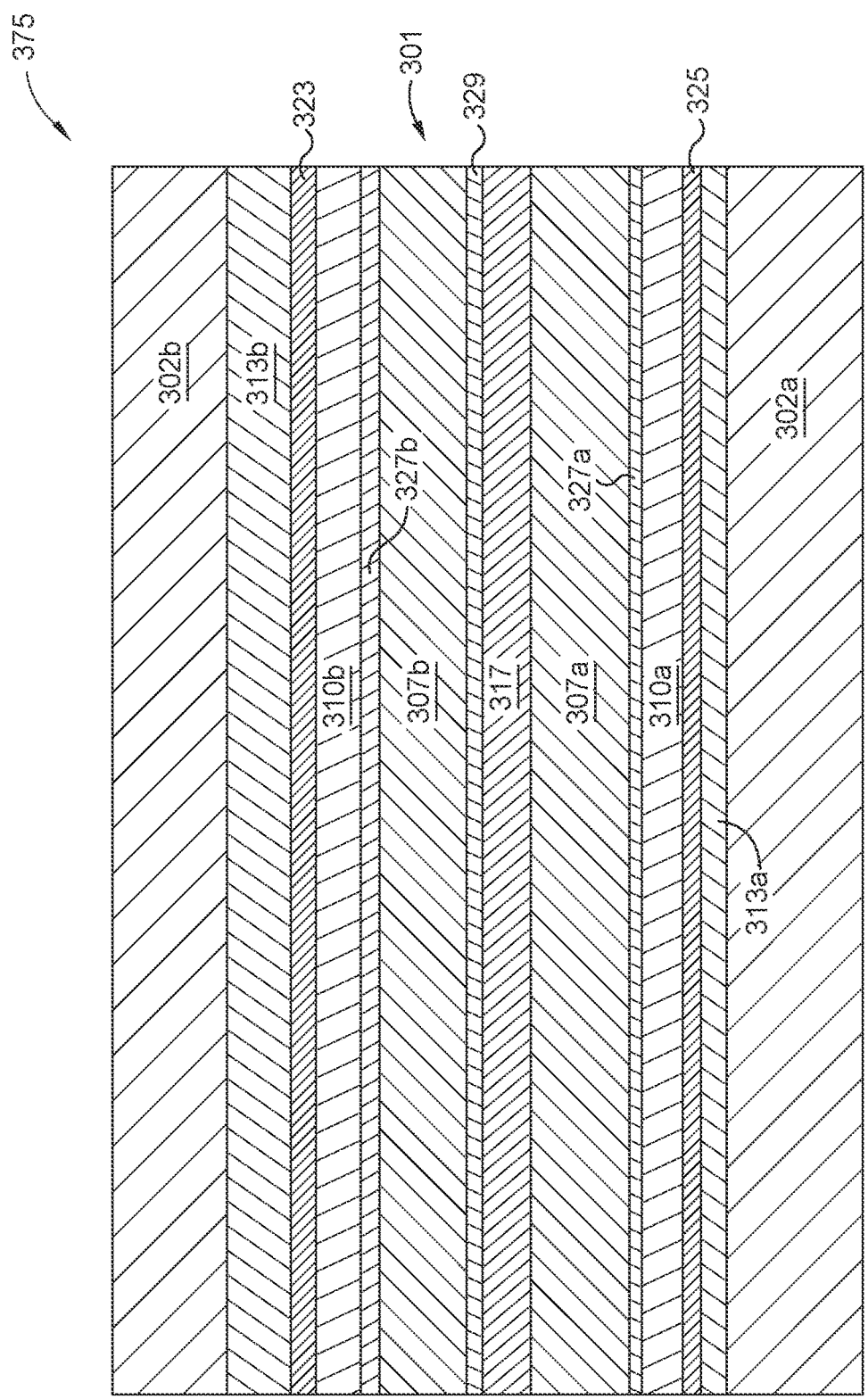

FIGS. 3A-3C are schematic MFS views of read heads 300, 350, 375, respectively, that include an SOT device 301 having dual free layers 307a, 307b, according to one or more implementations. The read heads 300, 350, 375 may be used as the read head 211 of FIG. 2.

The read head 300 of FIG. 3A includes a first shield 302a, a first insulation layer 313a disposed on the first shield 302a, a first spin Hall effect layer (SHL) 310a disposed on the insulation layer 313a, a first free layer (FL) 307a disposed on the first SHL 310a, a gap layer 317 disposed on the first FL 307a, a second FL 307b disposed on the gap layer 317, a second SHL 310b disposed on the second FL 307b, a second insulation layer 313b disposed on the second SHL 310b, and a second shield 302b disposed on the second insulation layer 313b. The first and second SHLs 310a, 310b may each individually include bismuth antimony (BiSb). The SHLs 310a, 310b may be referred to as spin-orbit torque (SOT) layers. The first and second FLs 307a, 307b may each individually include CoB, CoFeB, Co, CoFe, or NiFe. The first and second shields 302a, 302b may each individually include a magnetic material, such as NiFe. The first and second insulation layers 313a, 313b may each individually include insulating material such as SiN, or an oxide such as MgO, and can be used in combination with a Heusler alloy layer (discussed below in FIGS. 4A, 4B, and 5) adjacent to the BiSb layer to maintain texture and control Bi and Sb interdiffusion.

Side shields 319 are disposed adjacent to the SOT device 301 in the x-direction. The side shields 319 may include a magnetic material, such as NiFe. A third insulation layer 309 is disposed on the first SHL 310a and between the SOT device 301 and the side shields 319. The second SHL 310b is disposed in contact with the side shields 319. An antiferromagnetic cap layer 323 is disposed between the side shields 319 and the second insulation layer 313b. The first and second shields 302a, 302b, the first SHL 310a, and the first and second insulation layers 313a, 313b used in combination with a Heusler alloy layer (discussed below in FIGS. 4A, 4B, and 5) to control texture and interdiffusion, may each individually have a greater length in the x-direction than the first and second FLs 307a, 307b, the gap layer 317, and the second SHL 310b. A first current 321a flows from the first shield 302a into the gap layer 317, and a second current 321b flows from the gap layer 317 into the second shield 302b. A voltage may be applied to the first and second SHLs 310a, 310b.

The read head 350 of FIG. 3B is similar to the read head 300 of FIG. 3A. The read head 350 in FIG. 3B does not have insulation layers or shields. In the read head 350, the first FL 307a is disposed on the first SHL 310a, and an interlayer that includes a Heusler alloy, as discussed below in FIGS. 4A, 4B, and 5, could be used in combination with a nonmagnetic diffusion barrier in between the FL 307a and SHL layer 310a to reduce BiSb migration. The gap layer 317 is disposed on the first FL 307a, the second FL 307b is disposed on the gap layer 317, and the second SHL 310b is disposed on the second FL 307b and a buffer layer that includes a Heusler alloy (discussed below in FIGS. 4A-5) in combination with a nonmagnetic diffusion barrier layer could be used to control the (012) crystal orientation growth of the SHL 310*b*. The first and second SHLs 310*a*, 310*b* have a greater length in the x-direction than the first and second FLs 307*a*, 307*b* and the gap layer 317. A first current 321*a* flows from the first SHL 310*a* into the gap layer 317, and a second current 321*b* flows from the gap layer 317 into the second SHL 310*b*. A voltage may be applied to the first and second SHLs 310*a*, 310*b*.

The read head 375 of FIG. 3C is similar to the read head 300 of FIG. 3A. The read head 375 of FIG. 3C includes seed layers 325, 329 and interlayers 327*a*, 327*b*. The read head 375 includes the first shield 302*a*, the first insulation layer 313*a* disposed on the first shield 302*a*, a first seed layer 325 disposed on the insulation layer 313*a*, the first SHL 310*a* disposed on the first seed layer 325, The read head 375 includes a first interlayer 327*a* disposed on the first SHL 310*a*, the first FL 307*a* disposed on the first interlayer 327*a*, the gap layer 317 disposed on the first FL 307*a*, a second seed layer 329 disposed on the gap layer 317, the second FL 307*b* disposed on the second seed layer 329, a second interlayer 327*b* disposed on the second FL 307*b*, the second SHL 310*b* disposed on the second interlayer 327*b*, a cap layer 323 disposed on the second SHL 310*b*, the second insulation layer 313*b* disposed on the cap layer 323, and a second shield 302*b* disposed on the second insulation layer 313*b*. The capping layer 323 may include a migration barrier like a Heusler alloy layer (discussed below in FIGS. 4A-5) optionally in combination with an additional nonmagnetic migration barrier adjacent to the BiSb to control Bi, Sb migration. In one or more embodiments, each layer of the read head 375 has a same length in the x-direction. The present disclosure also contemplates that the layers of the read head 375 can have varying lengths in the x-direction.

The cap layer 323 includes a nonmagnetic material selected from the group consisting of SiN, TiN, $Al_2O_3$, $SiO_2$, NiFeTa, NiTa, NiW, NiFeW, CoHf, CoFeHf, Pt, Co, Cu, Ni, NiCu, CoCu, Ru, Ta, Cr, Au, Rh, other non-magnetic materials, and combinations thereof. The first seed layer 325 includes a silicide or GeNiFe layer optionally in combination with another non-magnetic barrier. The second seed layer 329 may include a GeNiFe layer optionally in combination with another non-magnetic barrier. The first interlayer 327*a* and the second interlayer 327*b* may each individually include a nonmagnetic Si or Ge transition metal alloy layer such as an NiFeGe or CoFeGe layer, a Heusler alloy or other alloy in combination with a material selected from the group consisting of: Cu, Ag, Si, Ge, Mn, Ni, Co, Mo, W, Ti, and/or B, or in combination with another nonmagnetic barrier to control BiSb intermixing and maintain BiSb texture.

While FIGS. 3A-3C each individually shows dual ferromagnetic or dual free layer SOT devices 301, the read heads 300, 350, 375 of FIGS. 3A-3C may instead be utilized with a single ferromagnetic or single free layer SOT device, or a single ferromagnetic or single free layer SOT device that includes an anti-ferromagnetic (AFM) layer, where the AFM layer may include a single layer or multiple layers of PtMn, NiMn, IrMn, IrMnCr, CrMnPt, FeMn, other antiferromagnetic materials, and/or combination(s) thereof. An exemplary single ferromagnetic or single free layer SOT device may include a substrate or shield, a buffer layer disposed on the substrate, a free layer disposed on the buffer layer, an interlayer deposed on the free layer, an SHL disposed on the interlayer, and a cap layer disposed on the SHL. An exemplary single ferromagnetic or single free layer SOT device that includes an AFM layer may include the AFM layer disposed adjacent to the single ferromagnetic or single free layer SOT device, where the AFM layer is recessed from the MFS. Additionally, the single or dual free layer based SOT devices described may be used in magnetic sensor applications outside of a read sensor/reader in magnetic recording, and such sensors may be similarly fabricated as the various reader stacks shown or described.

FIGS. 4A and 4B are schematic side views of top spin-orbit torque (SOT) devices 400, 450, according to one or more implementations.

Figure 5:
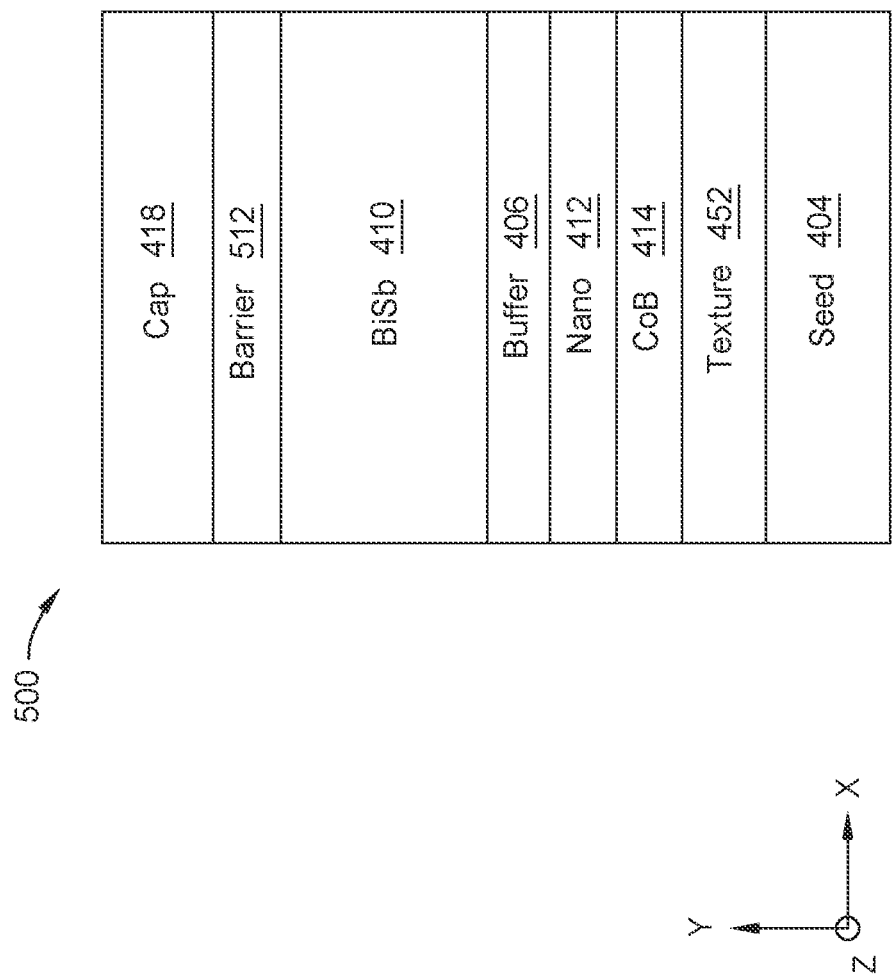
FIG. 5 is a schematic side view of a bottom SOT device, according to an implementation.

FIG. 5 is a schematic side view of a bottom SOT device 500, according to an implementation.

Each of the SOT devices 400, 450, 500 may include additional layers not shown in FIGS. 4A-5. The SOT devices 400, 450, 500 may each individually be used in the magnetic recording head of the magnetic recording device 100 of FIG. 1 or other suitable magnetic recording devices, such as the read head 211 and/or write head 210 of FIG. 2, and one or more of the read heads 300, 350, 375 of FIGS. 3A-3C. For example, the first and second seed layers 325, 329 and the first and second interlayers 327*a*, 327*b* of FIG. 3C may be the first insertion layer 416, the second insertion layer 417, and/or the NL 412 discussed below. Additionally, the various SOT devices/stacks of FIGS. 4A-5 may be used in a magnetic sensor and as part of a memory structure in MRAM such as that example shown in FIG. 8.

Furthermore, while the SOT device 400, 450, 500 are referred to as SOT devices, the SOT device 400, 450, 500 may each individually function as spin torque oscillator (STO) devices. Aspects of each SOT device 400, 450, 500 may be used in combination with one another. When the SOT device 400, 450, 500 are used in a write head, the current flows in-plane to the SOT layer or bismuth antimony (BiSb) layer 410, and the ferromagnetic (FM) or free layer is oscillated by the SOT generated by the spin Hall effect in the BiSb layer 410.

The SOT device 400 of FIG. 4A includes a first electrode 402*a*, a seed layer 404 disposed on the first electrode 402*a*, an optional buffer layer 406 disposed on the seed layer 404, an optional nucleation layer 408 disposed on the buffer layer 406, a BiSb layer 410 disposed on the optional nucleation layer 408 (or the buffer layer 406), an optional spacer layer 411 disposed on the BiSb layer 410, a nano layer (NL) 412 disposed on the optional spacer layer 411 (or the BiSb layer 410), a cobalt-boron (CoB) layer 414 disposed on the NL 412, a one or more insertion layers 416, 417 disposed on the CoB layer 414, a cap layer 418 disposed on the one or more insertion layers 416, 417, and a second electrode 402*b* disposed on the cap layer 418. The second electrode 402*b* is spaced from the first electrode 402*a* using the layers 404, 406, 408, 410, 412, 414, 416, 417, 418 between the first electrode 402*a* and the second electrode 402*b*. While shown, the first and second electrodes 402*a*, 402*b* are optional.

The cap layer 418 is spaced from the seed layer 404, and the cap layer 418 is nonmagnetic. Each of the layers 406, 408, 410, 412, 414, 416, 417 is between the seed layer 404 and the cap layer 418. The NL 412 is magnetic. The CoB layer 414 is between the NL 412 and the cap layer 418, and the CoB layer 414 is ferromagnetic. The one or more insertion layers 416, 417 are between the CoB layer 414 and the cap layer 418. The present disclosure contemplates that a majority of a phase of each of the layers 404, 406, 408, 410, 411, 412, 414, 416, 417, 418 can be crystalline, amorphous, or nanocrystalline.

In one or more embodiments, the NL 412 is formed of a magnetic material that includes one or more of cobalt (Co), nickel-iron (NiFe), cobalt-iron (CoFe), and/or a Heusler alloy. In one or more embodiments, the magnetic material of the NL 412 includes $Co_2FeGe$. In one or more embodiments, the magnetic material of the NL 412 includes CoFeX, where X is an element that does not readily interact with BiSb, such as Cu, Ag, Si, Ge, Mn, Ni, Co, Mo, W, Ti, and/or B. In such an embodiment, the NL 412 can have a negative magnetostriction. In one or more embodiments, the NL 412 is formed of Co or CoFe having an Fe atomic percentage within a range of 5% to 60% (such as 5%, 10%, 25%, or 60%), and a Co atomic percentage within a range of 35% to 90%. In one or more embodiments, the Fe atomic percentage is within a range of 10% to 60%. The Co atomic percentage and the Fe atomic percentage added together equal at least 95% of a total atomic percentage of the NL 412.

In one or more embodiments, a majority of a phase of the CoB layer 414 is amorphous. A boron (B) atomic percentage of the CoB layer 414 is within a range of 5% to 30%, and a cobalt (Co) atomic percentage of the CoB layer 414 is within a range of 65% to 90%. In one or more embodiments, the B atomic percentage is within a range of 10% to 30%. In one or more embodiments, the B atomic percentage is about 20%. The B atomic percentage and the Co atomic percentage added together equal at least 95% of a total atomic percentage of the CoB layer 414. In such an implementation, the CoB layer 414 is substantially free from other materials (such as nickel (Ni) and iron (Fe)). For example, other materials can be present in the CoB layer 414 at an overall atomic percentage that is 5% or less (such as 4% or less).

A first thickness T1 (along a downtrack direction) of the CoB layer 414 is at least 35 Angstroms, such as 40 Angstroms or higher. In one or more embodiments, the first thickness T1 is within a range of 50 Angstroms to 100 Angstroms. The first thickness T1 facilitates, for example, a negative magnetostriction. A second thickness T2 of the NL 412 is 5 Angstroms or less. In one or more embodiments, the second thickness T2 is 3.5 Angstroms or less, or 2.0 Angstroms or less. The second thickness T2 can facilitate adequate magnetic coupling of the CoB layer 414 to the BiSb layer 410. The present disclosure contemplates that a portion of the CoB layer 414 can migrate (e.g., leach) out toward the NL 412.

A ratio of the first thickness T1 to the second thickness T2 is 9:1 or higher, such as 12:1 or higher.

A third thickness T3 of the cap layer 418 is 100 Angstroms or less. In one or more embodiments, the third thickness T3 is 50 Angstroms or less, such as within a range of 15 Angstroms to 50 Angstroms. The CoB layer 414 has a resistivity that is at least 100 µOhms-cm. In one or more embodiments, the resistivity is of the CoB layer 414 is within a range of 120 µOhms-cm to 140 µOhms-cm or higher, such as 140 µOhms-cm or higher, or 150 µOhms-cm or higher. In one or more embodiments, the thicknesses of each of the spacer layer 411, the NL 412, the first insertion layer 416, the second insertion layer 417, and the cap layer 418 are less than 50 Angstroms. The CoB layer 414 has a coercivity less than 10 Oe, such as 8 Oe or less, 7 Oe or less, or 6 Oe or less.

The CoB layer 414 facilitates low coercivity, reduced shunting of magnetic (e.g., read) signals, negative magnetostriction, and high resistivity. The CoB layer 414 facilitates benefits such as high spin Hall effects, enhanced recording performance, and/or high signal-to-noise ratios. The use of the CoB layer 414 and the NL 412 facilitates negative magnetostriction and increased spin polarization and increased signal amplitude of the SOT device 400.

The one or more insertion layers 416, 417 include a first insertion layer 416, and a second insertion layer 417 between the first insertion layer 416 and the cap layer 418. In one or more embodiments, the first insertion layer 416 is formed of hafnium (Hf), and the second insertion layer 417 is formed of tantalum (Ta). Each of the first insertion layer 416 and the second insertion layer 417 has a thickness T4, T5 within a range of 10 Angstroms to 15 Angstroms. Other materials are contemplated for the insertion layers 416, 417. The insertion layers 416, 417 facilitate controlling magnetostriction while assisting the cap layer 418 in protecting the layers of the SOT device 400 from environmental factors.

The optional spacer layer 411, if used, is a high resistive and nonmagnetic layer and (1) can be formed of Fe, Co, or magnetic alloys such as NiFe, CoFe, which in turn is alloyed with relatively non SOT intermixing elements like Cu, Ag, Ge, Mn, Ni, Co, Mo, W, Ti, and/or B to form an amorphous nonmagnetic layer, or (2) could be formed of but not limited to a noninteracting high resistive layer like an oxide (such as TiO), a nitride (such as TiN), and/or a boride (such as TiB and/or ZrB). The optional spacer layer 411 can be similar to the first interlayer 327a and/or the second interlayer 327b of the read head 375.

The SOT device 450 shown in FIG. 4B is similar to the SOT device 400 of FIG. 4A. The SOT device 450 also includes a texture layer 452 disposed between the seed layer 404 and the buffer layer 406, and the NL 412 is disposed on an interlayer 454 disposed on the BiSb layer 410. As such, the SOT device 450 includes the seed layer 404, the texture layer 452 disposed on the seed layer 404, the buffer layer 406 disposed on the texture layer 452, the optional nucleation layer 408 disposed on the buffer layer 406, the BiSb layer 410 disposed on the optional nucleation layer 408 or the buffer layer 406, the interlayer 454 disposed on the BiSb layer 410, the NL 412 disposed on the interlayer 454, the CoB layer 414 disposed on the NL 412, the first insertion layer 416 disposed on the CoB layer 414, the second insertion layer 417 disposed on the first insertion layer 416, and the cap layer 418 disposed on the second insertion layer 417. While not shown in FIG. 4B, the SOT device 450 may include the first and second electrodes 402a, 402b outwardly of the seed layer 404 and the cap layer 418. The texture layer 452 can include RuAl, CrMo, or multilayers of CrMoX with CrX (where X=Ti, Ru, Mo, or W). In one or more embodiments, the interlayer 454 is nonmagnetic.

The SOT device 500 shown in FIG. 5 is similar to the SOT devices 400 and 450 shown in FIGS. 4A-4B, except the SOT device 500 is in the bottom configuration versus the top configuration shown in FIGS. 4A-4B. For the SOT device 500, the CoB layer 414 is disposed below the BiSb layer 410. The SOT device 500 shown in FIG. 5 includes the seed layer 404, the texture layer 452 disposed on the seed layer 404, the CoB layer 414 disposed on the texture layer 452, the NL 412 disposed on the CoB layer 414, the buffer layer 406 disposed on the NL 412, the BiSb layer 410 disposed on the buffer layer 406, a barrier layer 512 disposed on the BiSb layer 410, and the cap layer 418 disposed on the barrier layer 512. While not shown in FIG. 5, the SOT device 500 can include the first and second electrodes 402a, 402b and/or the nucleation layer 408. In one or more embodiments, the barrier layer 512 is a high resistive layer that is crystalline and includes zirconium nitride (ZrN) and/or titanium nitride (TiN). In one or more embodiments, the barrier layer 512 is a high resistive layer that is nonmagnetic and amorphous, and can be similar to the first interlayer 327a and/or the second interlayer 327b. The barrier layer 512 can be formed of a noninteracting high resistive layer like an oxide (such as TiO), a nitride (such as TiN), and/or a boride (such as TiB and/or ZrB). The barrier layer 512 can facilitate reduced shunting from the cap layer 418 to the BiSb layer 410.

For the SOT devices 400, 450, 500, the BiSb layer 410 may be the first SHL 310a and/or the second SHL 310b of FIGS. 3A-3C. The BiSb layer 410 may have a thickness T6 in the y-direction (e.g., along the downtrack direction) that is within a range of about 60 Å to about 200 Å. The BiSb layer 410 may be referred to herein as a spin Hall effect (SHE) layer, a spin orbit torque (SOT) layer, or a topological insulator. The BiSb layer 410 may include undoped BiSb or doped BiSbX, where the dopant is in an atomic percentage less than about 10%, and where X is extracted from elements that do not readily interact with either Bi or Sb, such as Cu, Ag, Si, Ge, Mn, Ni, Co, Mo, W, Ti, and/or B, or in alloy combinations with one or more of the aforementioned elements, such as CuAg, CuNi, CoCu, AgSn. The BiSb layer 410 can have a (012) crystal orientation or a (001) crystal orientation.

In embodiments where the SOT devices 400, 450, 500 include the first and second electrodes 402a, 402b, the first and second electrodes 402a, 402b may each individually include a nonmagnetic, low resistivity metal. For example, the first and second electrodes 402a, 402b may each include Ru, CuAg, Ta(alpha), W(alpha), Mo, Cu, Ag, Rh, Pt, among others. Low to moderate resistivity magnetic materials can be used if the first and second electrodes 402a, 402b are far enough away not to interfere with FM/SOT interactions. The thickness of each of the first and second electrodes 402a, 402b in the y-direction is greater than or equal to about 100 Å.

The SOT devices 400, 450, 500 of FIGS. 4A, 4B, and 5 may each be used as the SOT device 301 of each read head 300, 350, 375 of FIGS. 3A-3C.

As described further below, the present disclosure contemplates a variety of properties, materials, features, components, and/or aspects for the SOT devices 400, 450, 500 and the layers thereof. Such properties, materials, features, components, and/or aspects may be used in place of (or in addition to) certain properties, materials, features, components, and/or aspects described above).

The texture layer 452 can include RuAl (where Ru is within a range of about 45% to about 55% by atomic percentage), CrMo (where Mo is within a range of about 25% to about 50% by atomic percentage), or multilayers of CrMoX with CrX (where X=Ti, Ru, Mo, or W). The texture layer 452 has a (001) texture. The texture layer 452 may have a B2 or BCC crystalline structure where the a-axis lattice parameter is about 2.95 Angstroms to about 3.05 Angstroms. The texture layer 452 has a thickness in the y-direction of about 30 Angstroms to about 50 Angstroms.

Each of the buffer layer 406, the NL 412, the interlayer 454, the first insertion layer 416, the second insertion layer 417, and/or the nucleation layer 408 can include magnetic or nonmagnetic Heusler alloys, where the Heusler alloys may be full Heusler alloys (i.e., $X_2YZ$) or half Heusler alloys (i.e., XYZ). Full $X_2YZ$ type Heusler alloys generally have L21, cF16, B2 type structures with an a-axis lattice parameter in a range of about 5.70 Angstroms to about 6.20 Angstroms, which can match to the embodiments in which the texture layer 452 that has RuAl or CrMo. Half XYZ type Heusler alloys generally have a C1b type or Pm-3m type structure with an a-axis lattice parameter in a range of about 2.85 Angstroms to about 3.10 Angstroms. However, the type or structure may vary with respect to both half and full Heusler alloys. For instance, RuMnAl, RhMnAl, and $Al_2CuRh$, have a Pm-3m structure, and $Ni_2MnAl$ and $Mn_2NiAl$ have cF16 structures while $Al_2NiMn$ has a B2 structure.

With both full and half Heusler alloys, X may be one of Li, Mg, Mn, Fe, Co, Ni, Cu, Ru, Rh, Pd, Ag, Cd, Ir, Pt, or Au; Y may be one of Li, Be, Sc, Ti, V, Cr, Mn, Fe, Co, Ni, Zn, Y, Zr, Nb, Mo, Hf, or W; and Z may be one of B, Mg, Al, Si, Zn, Ga, Ge, As, In, Sn, Sb, Pb, or Bi. Some nonmagnetic Heusler alloy examples include $Ti_2MnAl$, $Fe_2VAl$ (a-axis=5.78 Angstroms), $Cr_2CoAl$ (a-axis=5.88 Angstroms), CoTiSb (a-axis=5.88 Angstroms), $Mn_2VSi$, $V_2VAl$ (a-axis=6.14 Angstroms), $[Mn_{1-x}Co_x]_2VAl$ (x=0.5) (a-axis=6.05 Angstroms), $[Mn_{1-x}Co_x]_2VSi$ (x=0.25) (a-axis=6.18 Angstroms), and CoMnNbAl, CoZrFeAl. Magnetic Heusler alloy examples having large spin polarizations include $Co_2MnSb$ (a-axis=5.94 Angstroms), $Co_2MnGe$ (a-axis=5.75 Å), CoMnSb (a-axis=5.90 Angstroms) NiMnSb, $Co_2FeGe$, $Co_2MnSn$, and $Co_2MnFeGe$, each of which does not readily mix with the BiSb layer 410.

Each of the buffer layer 406, the NL 412, the interlayer 454, the first insertion layer 416, the second insertion layer 417, and/or the nucleation layer 408 can include: (1) amorphous/nanocrystalline layers formed from Heusler alloys in combination with elements, or alloy layers that don't readily mix with the SOT or NL layers, or uniform alloys formed by co-sputtering Heusler alloys with other elements, or alloys which don't readily intermix with the SOT or NL layers, or (2) polycrystalline Heusler alloys, which are epitaxial layers in the SOT devices 400, 450, 500. With respect to amorphous/nanocrystalline buffer layers 406, nucleation layers 408, NLs 412, and insertion layers 416, 417, thin polycrystalline Heusler alloys (both magnetic and nonmagnetic, and full or half Heusler alloys) can be used when alloyed with other elements that don't readily mix with the BiSb layer 410, such as Cu, Ag, Si, Ge, Mn, Ni, Co, Mo, W, Ti, and/or B, or in alloy combinations with one or more of aforementioned elements, such as CuAg, CuNi, CoCu, AgSn. The nucleation layer 408 can also be very thin (e.g., dusting) layers of these aforementioned elements, or in very thin alloy combination of these elements like CuAg, CuNi, CoCu, and/or AgSn.

In one or more embodiments, utilizing amorphous or nanocrystalline layers formed from Heusler alloys alloyed with other elements that don't readily mix with the BiSb layer 410 forms effectively nonmagnetic amorphous/nanocrystalline buffer and nucleation layers 406, 408 in several situations: (1) after deposition and room temperature (RT) intermixing; (2) post annealing prior to the BiSb layer 410 deposition; (3) in single uniform composition layer nonmagnetic amorphous/nanocrystalline alloy depositions with single alloy targets; or (4) co-sputtered with targets which contain the elements of the Heusler alloy and the non-readily mixed multi-elemental combination of elements mentioned above.

In one or more embodiments, the NL 412, the interlayer 454, the first insertion layer 416, and/or the second insertion layer 417 are formed in a similar fashion as the buffer and nucleation layers 406, 408 (although the nucleation layer 408 can also be just these aforementioned elements or any nonmagnetic alloy combination of these elements); however, it is not necessary that after deposition and RT intermixing that the resulting graded NL 412, interlayer 454, or insertion layers 416, 417 be amorphous, as long as the resulting layer has a high resistance and reduces NL 412/interlayer 454/insertion layer 416, 417 intermixing with the BiSb layer 410 or intermixing with the CoB layer 414.

Magnetic alloys and magnetic Heusler alloys can be used in combinations with other elements or alloys above such that when deposited, the materials intermix at room temperature, or after post annealing, to form a stack (which can be magnetic or nonmagnetic). Examples include layers of NiFeX, CoFeX, NiX, FeX, CoX, where X is an element that does not readily interact with BiSb, such as Cu, Ag, Si, Ge, Mn, Ni, Co, Mo, W, Ti, and/or B, and/or magnetic Heusler alloys deposited on non-interacting element or alloy layers like Ge layers and in single alloy deposition layers where the resulting Ge content in the intermixed alloy can render the intermixed alloy nonmagnetic for the interlayer 454 (e.g., in the case of alloying with Ge the Ge content can be greater than or equal to about 44% by atomic percentage); or in combination with sufficiently thick layers of elements which do not readily interact with BiSb, such as Cu, Ag, Si, Ge, Mn, Ni, Co, Mo, W, Ti, and/or B, to form multi-element high resistivity combinations thereof; or single polycrystalline nonmagnetic Heusler layers.

Another example of materials that may be used for the interlayer 454/NL 412 stack include: Ge/CoFe/NiFeTaN (where Ge/CoFe may form a single layer at room temperature or may be deposited as an alloy layer).

The NL 412 may include a magnetic material, such as polycrystalline magnetic Heusler alloys. Magnetic Heusler examples have large spin polarizations, and examples of magnetic Heusler alloys that can be used in the NL 412 include $Co_2MnSb$, $Co_2MnGe$, CoMnSb, NiMnSb, $Co_2FeGe$, $Co_2MnSn$, and $Co_2MnFeGe$, which do not readily mix with BiSb layer 410.

In one or more embodiments, the NL 412 is crystalline and is formed of a highly polarized Heusler layer.

It is to be further understood that a plurality of the SOT devices 400 can be configured together as part of a memory cell array in which the BiSb layer 410 is a spin orbit material electrode, where a top electrode 402b can be disposed over the cap layer 418; that a plurality of the SOT devices 450 can be configured together as part of a memory cell array in which the BiSb layer 410 is a spin orbit material electrode, where a top electrode (not shown) can be disposed over the cap layer 418; and that a plurality of the SOT devices 500 can be configured together as part of a memory cell array in which the BiSb layer 410 is a spin orbit material electrode, where a top electrode can be disposed over the cap layer 418. Each of the memory cells may be part of a two-terminal device or a three-terminal device. The spin orbit material electrode and the top electrode may serve as bit lines, word lines, read word lines, write word lines, and combinations thereof. The memory cell array may be implemented as a cross-point array or other architectures.

As noted above, each of the SOT devices 400, 450, and 500 of FIGS. 4A-5 may be utilized as BiSb STO devices. BiSb based STO devices, such as the SOT devices 400, 450, and 500 of FIGS. 4A-5, typically have a larger SHA as compared to other STO based devices under the same input current density. As such, BiSb based STO devices utilized in read heads have a high performance. The present disclosure contemplates that other materials (other than BiSb) may be used for the SOT layer 410.

Figure 6A:
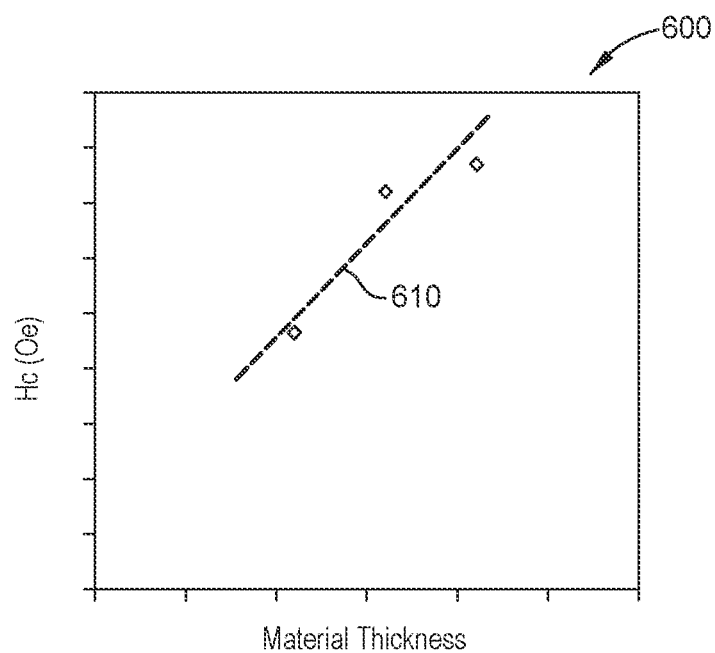
FIG. 6A is a schematic view of a graph showing coercivity $H_c$ versus CoB free layer (FL) material thickness.

FIG. 6A is a schematic view of a graph 600 showing coercivity He versus CoB free layer (FL) material thickness.

Figure 6B:
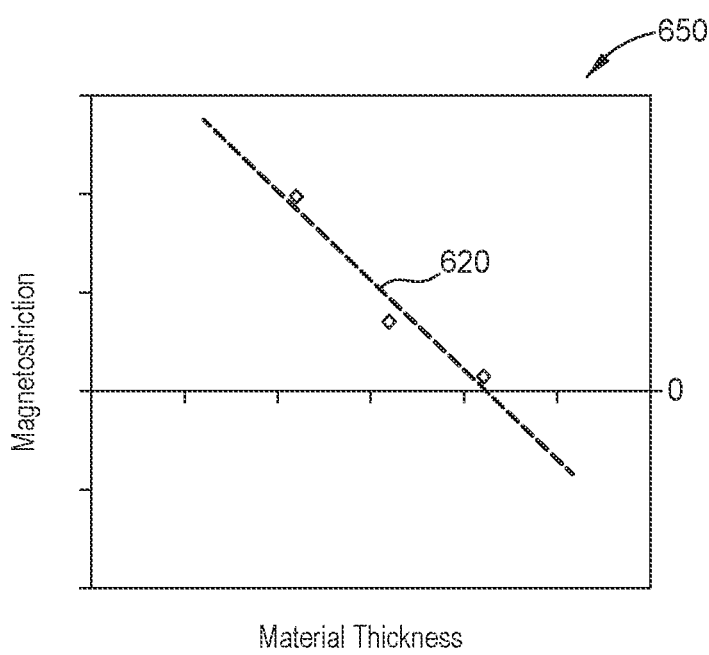
FIG. 6B is a schematic view of a graph showing magnetostriction versus CoB (FL) material thickness.

FIG. 6B is a schematic view of a graph 650 showing magnetostriction versus CoB FL material thickness.

A first line 610 fitted to data points shows that as the thickness of the material increases, the coercivity increases. A second line 620 fitted to data points shows that as the thickness of the material increases, the magnetostriction becomes negative. Hence, a negative magnetostriction can be correlated with higher coercivity and/or lower resistivity (which can hinder device performance).

Using implementations of the present disclosure, all of a negative magnetostriction, lower coercivity, and higher resistivity are facilitated at relatively low material thicknesses.

Figure 7A:
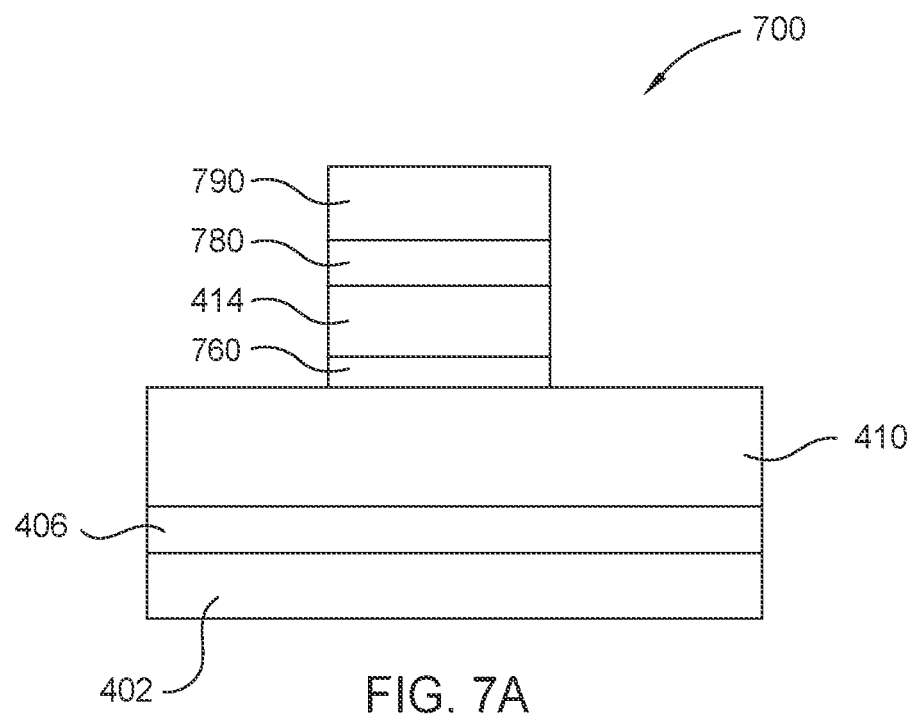
FIG. 7A is a schematic cross-sectional view of a SOT device for use in a MAMR write head, such as a MAMR write head that can be used as part of the magnetic recording head of the magnetic recording device of FIG. 1 or other suitable magnetic recording devices (e.g., media drives), according to one implementation.

FIG. 7A is a schematic cross-sectional view of a SOT device 700 for use in a MAMR write head, such as a MAMR write head that can be used as part of the magnetic recording head of the magnetic recording device 100 of FIG. 1 or other suitable magnetic recording devices (e.g., media drives), according to one implementation. The SOT device 700 includes a doped BiSb layer 410 with a (001) orientation, or alternatively, an undoped BiSb layer 410 with a (012) orientation, formed over a buffer layer 406 (or nucleation layer 408), formed over a shield or substrate 402, such as the BiSb layer 410 of FIGS. 4A-5. The buffer layer 406 may include a Heusler alloy as described above in FIGS. 4A-5, and have the same or similar properties as described above with respect to various embodiments. The CoB layer 414 is formed over the BiSb layer 410. The CoB layer 414 can be referred to as a spin torque layer (STL). As described above, the CoB layer 414 includes a ferromagnetic material such as one or more layers of CoB and/or Co. The CoB layer 414 may be a free layer, such as the free layers 307a, 307b of FIGS. 3A-3C. As such, the CoB layer 414 may be referred to as a free layer.

In one or more embodiments, an electrical current shunt block layer 760 is disposed between the BiSb layer 410 and the CoB layer 414. The electrical current shunt blocking layer 760 reduces electrical current from flowing from the BiSb layer 410 to the CoB layer 414 but allows spin orbital coupling of the BiSb layer 410 and the CoB layer 414. In one or more embodiments, the electrical current shunt blocking layer 760 comprises a magnetic material which provides greater spin orbital coupling between the BiSb layer 410 and the CoB layer 414 than a non-magnetic material. In one or more embodiments, the electrical current shunt blocking layer 760 includes FeCo, FeCoM, FeCoMO, FeCoMMeO, FeCoM/MeO stack, FeCoMNiMnMgZnFeO, FeCoM/NiMnMgZnFeO stack, multiple layers/stacks thereof, or combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr. In certain embodiments, the electrical current shunt blocking layer 760 is formed to a thickness from about 10 Å to about 100 Å. In certain aspects, an electrical current shunt blocking layer 760 having a thickness of over 100 Å may reduce spin orbital coupling of the BiSb layer 410 and the CoB layer 414. In certain aspects, an electrical current shunt blocking layer having a thickness of less than 10 Å may not sufficiently reduce electrical current from BiSb layer 410 to the CoB layer 414.

In one or more embodiments, additional layers are formed over the CoB layer 414 such as a spacer layer 780 and a pinning layer 790. The pinning layer 790 can partially pin the CoB layer 414. The pinning layer 790 includes a single or multiple layers of PtMn, NiMn, IrMn, IrMnCr, CrMnPt, FeMn, other antiferromagnetic materials, or combinations thereof. The spacer layer 780 comprises single or multiple layers of magnesium oxide, aluminum oxide, other non-magnetic materials, or combinations thereof.

Figure 7B:
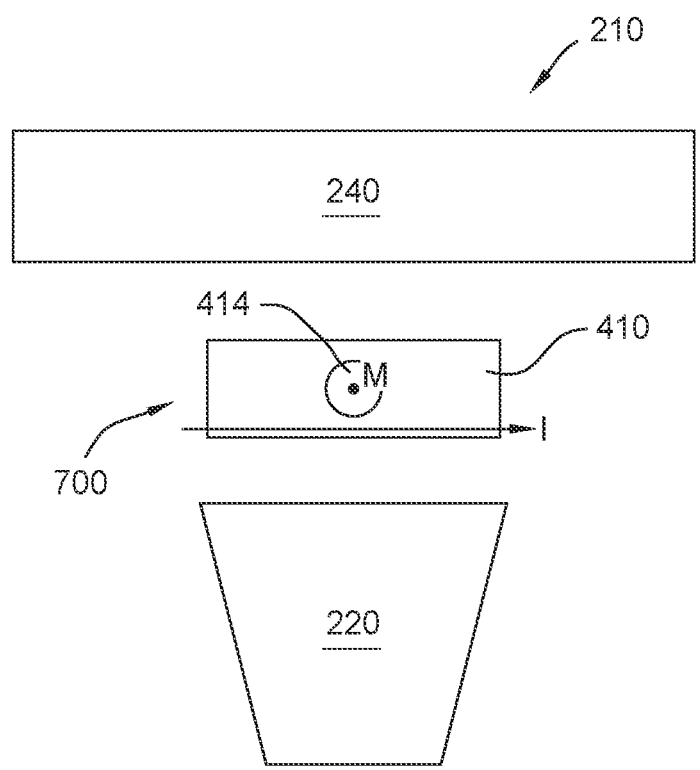
FIGS. 7B-7C are schematic MFS views of a portion of a MAMR write head with the SOT device of FIG. 7A, according to one or more implementations.
Figure 7C:
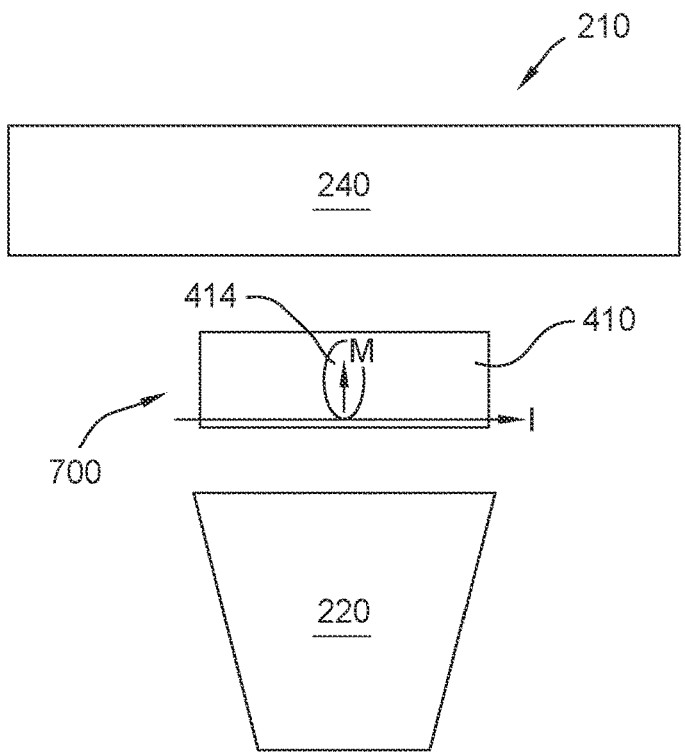

FIGS. 7B-7C are schematic MFS views of a portion of a MAMR write head 210 with the SOT device 700 of FIG. 7A, according to one or more implementations. The MAMR write head 210 can be the write head in FIG. 2 or other suitable write heads usable in the drive 100 of FIG. 1 or other suitable magnetic media drives such as tape drives. The MAMR write head 210 includes a main pole 220 and a trailing shield 240 in a down-track direction. The SOT device 700 is disposed in a gap between the main pole 220 and the trailing shield 240.

During operation, charge current through a BiSb layer or layer stack 410 acting as a spin Hall layer generates a spin current in the BiSb layer. The spin orbital coupling of the BiSb layer and the CoB layer 414 (a spin torque layer (STL)) causes switching or precession of magnetization of the CoB layer 414 by the spin orbital coupling of the spin current from the BiSb layer 410. Switching or precession of the magnetization of the CoB layer 414 can generate an assisting AC field to the write field. Energy assisted write heads based on SOT have multiple times greater power efficiency in comparison to MAMR write heads based on spin transfer torque. As shown in FIG. 7B, an easy axis of a magnetization direction of the CoB layer 414 is perpendicular to the MFS from shape anisotropy of the CoB layer 414, from the pinning layer 790 of FIG. 7A, and/or from hard bias elements proximate the CoB layer 414. As shown in FIG. 7C, an easy axis of a magnetization direction of the STL 770 is parallel to the MFS from shape anisotropy of the CoB layer 414, from the pinning layer 790 of FIG. 7A, and/or from hard bias elements proximate the CoB layer 414.

Figure 8:
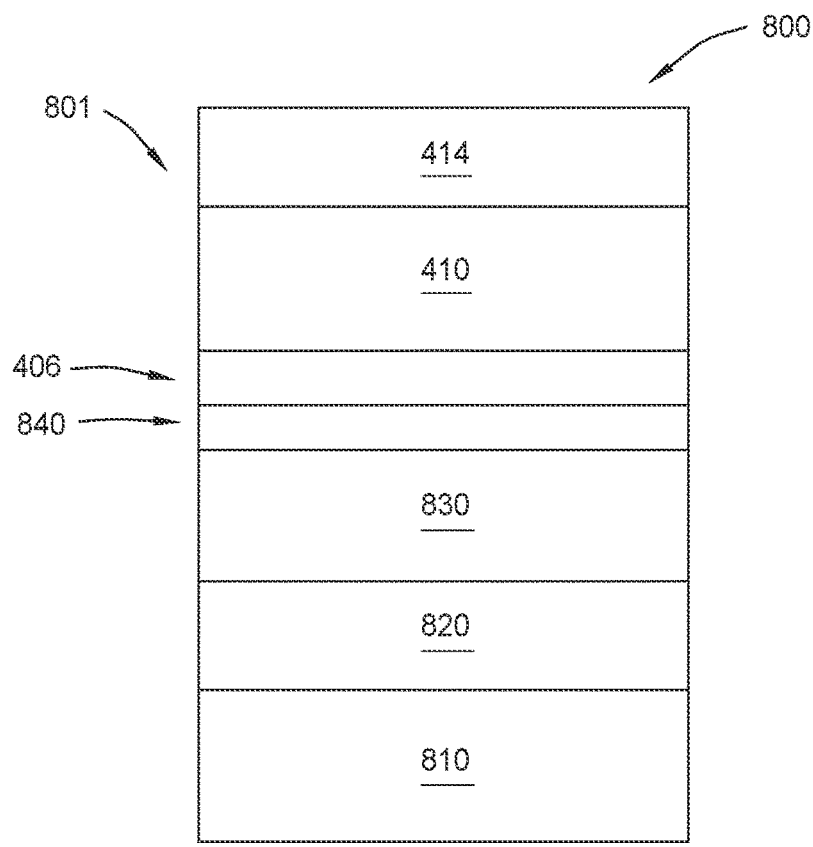
FIG. 8 is a schematic cross-sectional view of a SOT magnetic tunnel junction (MTJ) used as an MRAM device, according to one implementation.

FIG. 8 is a schematic cross-sectional view of a SOT magnetic tunnel junction (MTJ) 801 used as an MRAM device 800, according to one implementation. The SOT MTJ 801 can involve tunnel magnetoresistance (TMR). The MRAM device 800 includes a reference layer (RL) 810, a spacer layer 820 over the RL 810, a recording layer 830 over the spacer layer 820, a buffer layer 406 (or nucleation layer 408) over an electrical current shunt block layer 840 over the recording layer 830, a BiSb layer or layer stack 410 over the buffer layer 406, and a CoB layer 414 over the BiSb layer or layer stack 410. The BiSb layer 410 may be the BiSb layer 410 of FIGS. 4A-5. The buffer layer 406 may include a Heusler alloy as described above in FIGS. 4A-5 and have the same or similar properties as described above with respect to various embodiments. The BiSb layer 410 may be a doped BiSb layer having a (012) orientation or an undoped BiSb layer having a (001) orientation. The RL 810 may be a free layer, such as the free layer 307a, 307b of FIGS. 3A-3C. As such, the RL 810 may be referred to as a free layer.

The RL 810 includes single or multiple layers of CoFe, other ferromagnetic materials, and/or combinations thereof. The spacer layer 820 includes single or multiple layers of magnesium oxide, aluminum oxide, other dielectric materials, and/or combinations thereof. The recording layer 830 includes single or multiple layers of CoFe, NiFe, other ferromagnetic materials, and/or combinations thereof.

As noted above, in certain embodiments, the electrical current shunt block layer 840 is disposed between the buffer layer 406 and the recording layer 830. The electrical current shunt blocking layer 840 reduces electrical current from flowing from the BiSb layer 410 to the recording layer 830 but allows spin orbital coupling of the BiSb layer 410 and the recording layer 830. For example, writing to the MRAM device can be facilitated by the spin orbital coupling of the BiSb layer and the recording layer 830, which facilitates switching of magnetization of the recording layer 830 by the spin orbital coupling of the spin current from the BiSb layer 410. In one or more embodiments, the electrical current shunt blocking layer 840 includes a magnetic material which provides greater spin orbital coupling between the BiSb layer 410 and the recording layer 830 than a non-magnetic material. In one or more embodiments, the electrical current shunt blocking layer 840 includes FeCoM, FeCoMO, FeCoMMeO, FeCoM/MeO stack, FeCoMNiMnMgZnFeO, FeCoM/NiMnMgZnFeO stack, multiple layers/stacks thereof, and/or combinations thereof, in which M is one or more of B, Si, P, Al, Hf, Zr, Nb, Ti, Ta, Mo, Mg, Y, Cu, Cr, and/or Ni, and Me is Si, Al, Hf, Zr, Nb, Ti, Ta, Mg, Y, or Cr.

The MRAM device 800 of FIG. 8 may include other layers, such as pinning layers, pinning structures (e.g., a synthetic antiferromagnetic (SAF) pinned structure), electrodes, gates, and/or other structures. Other MRAM devices besides the structure of FIG. 8 can be formed utilizing an un-doped BiSb layer 410 with a (001) orientation, or alternatively, a doped BiSb layer 410 with a (012) orientation, over a buffer layer 406 to form a SOT MTJ 801.

The CoB layer described herein facilitates a high resistivity, a negative magnetostriction, and a low coercivity at relatively low thicknesses, which facilitates SOT performance and/or magnetic recording performance.

Figure 9:
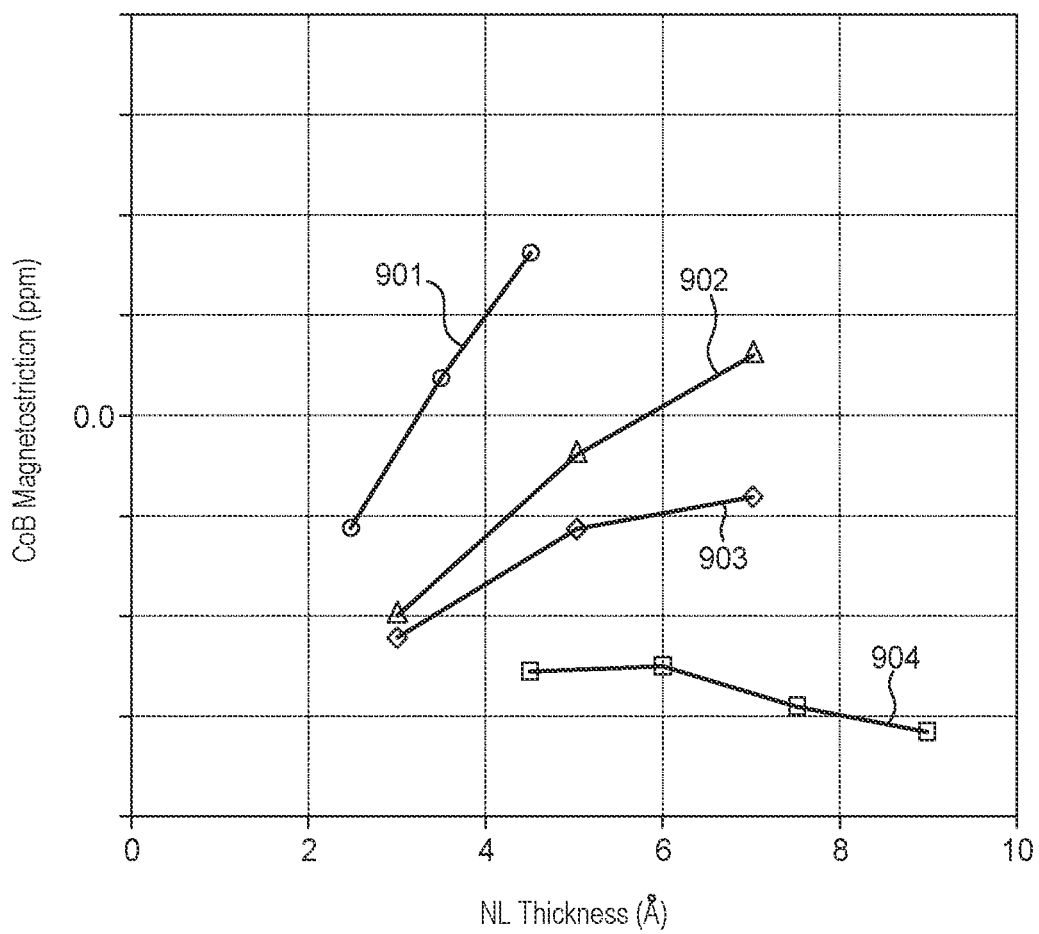
FIG. 9 is a schematic view of a graph showing a magnetostriction (in ppm) for the CoB layer (FL) versus the NL material thickness (in Angstroms).

FIG. 9 is a schematic view of a graph showing a magnetostriction (in ppm) for the CoB layer (FL) 414 versus the NL 412 material thickness (in Angstroms).

Each profile 901-904 corresponds to a Co-containing material with a different Fe atomic percentage. For a first profile 901, the Fe atomic percentage is 60%. For a second profile 902, the Fe atomic percentage is 25%. For a third profile 903, the Fe atomic percentage is 10%. For a fourth profile 904, the Fe atomic percentage is 0% such that the material is Co.

As shown in FIG. 9, thinner magnetic NL's 412 can be used (including Heuslers) to reduce magnetostriction of the CoB layer 414 at a given thickness for the CoB layer 414.

In one embodiment, a spin-orbit torque (SOT) device includes a seed layer, and a cap layer spaced from the seed layer. The cap layer is nonmagnetic. The SOT device includes a spin-orbit torque (SOT) layer, and a nano layer (NL) between the seed layer and the cap layer. The NL is magnetic. The SOT device includes a cobalt-boron (CoB) layer between the seed layer and the cap layer, and the CoB layer is ferromagnetic. The CoB layer is substantially free from materials other than cobalt (Co) and boron (B). A majority of a phase of the CoB layer is amorphous. A B atomic percentage of the CoB layer is within a range of 5% to 30%, and a Co atomic percentage of the CoB layer is within a range of 65% to 90%. The B atomic percentage and the Co atomic percentage added together equal at least 95% of a total atomic percentage of the CoB layer. In one or more examples, the B atomic percentage is about 20%. A first thickness of the CoB layer is at least 40 Angstroms. In one or more examples, the first thickness is within a range of 50 Angstroms to 100 Angstroms. A second thickness of the NL is 5 Angstroms or less. A third thickness of the cap layer is 50 Angstroms or less. The SOT device includes a first insertion layer between the CoB layer and the cap layer, and the first insertion layer formed of hafnium (Hf). The SOT device includes a second insertion layer between the first insertion layer and the cap layer, and the second insertion layer is formed of tantalum (Ta). Each of the first insertion layer and the second insertion layer has a thickness within a range of 10 Angstroms to 15 Angstroms. A magnetic recording device having the SOT device is also disclosed.

In one embodiment, a spin-orbit torque (SOT) device includes a spin-orbit torque (SOT) layer that includes bismuth antimony (BiSb), and a cobalt-boron (CoB) layer. The CoB layer is ferromagnetic. The SOT device includes a nano layer (NL) between the SOT layer and the CoB layer. The NL is magnetic. The SOT device includes one or more insertion layers above the CoB layer such that the CoB layer is between the NL and the one or more insertion layers. The NL is formed of a magnetic material that includes one or more of cobalt (Co), nickel-iron (NiFe), cobalt-iron (CoFe), or a Heusler alloy. In one or more examples, the magnetic material of the NL includes $Co_2FeGe$. The CoB layer has a resistivity that is at least 120 μOhms-cm. The SOT device includes a seed layer, and a cap layer spaced from the seed layer. The cap layer is nonmagnetic. The SOT device includes a buffer layer between the seed layer and the SOT layer. Each of the SOT layer, the NL, the CoB layer, and the one or more insertion layers is between the buffer layer and the cap layer. The SOT device includes a first electrode, and a second electrode spaced from the first electrode. Each of the seed layer, the cap layer, and the buffer layer is between the first electrode and the second electrode. A magnetic recording device having the SOT device is also disclosed.

In one embodiment, a spin-orbit torque (SOT) device includes a seed layer, and a cap layer spaced from the seed layer. The cap layer is nonmagnetic. The SOT device includes a polarizing means between the seed layer and the cap layer. The polarizing means is magnetic. The SOT device includes a cobalt-boron (CoB) layer between the polarizing means and the cap layer, and the CoB layer is ferromagnetic. The SOT device includes one or more insertion layers between the CoB layer and the cap layer.

Benefits of the present disclosure include lower negative magnetostriction, lower coercivity, and high resistivity at relatively low thicknesses. Benefits of the present disclosure also include high spin Hall effects, enhanced recording performance (e.g., SOT performance), increased spin polarization, increased signal amplitudes, high signal-to-noise ratios, and/or reduced shunting of magnetic signals.

It is contemplated that one or more aspects disclosed herein may be combined. Moreover, it is contemplated that one or more aspects disclosed herein may include some or all of the aforementioned benefits. As an example, one or more of the aspects, components, features, operations, and/or properties of the magnetic recording device 100, the read/write head 200, the read head 300, the read head 350, the read head 375, the SOT device 400, the SOT device 450, the SOT device 500, the SOT device 700, and/or the MRAM device 800 may be combined.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) device, comprising:
a first electrode;
a seed layer disposed over the first electrode;
a cap layer spaced from the seed layer, wherein the cap layer is nonmagnetic;
a spin Hall layer;
a nano layer (NL) between the seed layer and the cap layer, wherein the NL is magnetic;
a cobalt-boron (CoB) layer between the seed layer and the cap layer, wherein the CoB layer is ferromagnetic and the CoB layer is substantially free from materials other than cobalt (Co) and boron (B), wherein there is spin orbital coupling between the CoB layer and the spin Hall layer; and
a second electrode disposed over the cap layer.

2. The SOT device of claim 1, wherein a majority of a phase of the CoB layer is amorphous.

3. The SOT device of claim 1, wherein a B atomic percentage of the CoB layer is within a range of 5% to 30%, and a Co atomic percentage of the CoB layer is within a range of 65% to 90%.

4. The SOT device of claim 3, wherein the B atomic percentage and the Co atomic percentage added together equal at least 95% of a total atomic percentage of the CoB layer.

5. The SOT device of claim 3, wherein the B atomic percentage is about 20%.

6. The SOT device of claim 1, wherein a first thickness of the CoB layer is at least 35 Angstroms.

7. The SOT device of claim 6, wherein the first thickness is within a range of 50 Angstroms to 100 Angstroms.

8. The SOT device of claim 6, wherein a second thickness of the NL is 5 Angstroms or less.

9. The SOT device of claim 8, wherein a third thickness of the cap layer is 50 Angstroms or less.

10. The SOT device of claim 1, further comprising:
a first insertion layer between the CoB layer and the cap layer, the first insertion layer formed of hafnium (Hf); and
a second insertion layer between the first insertion layer and the cap layer, the second insertion layer formed of tantalum (Ta).

11. The SOT device of claim 10, wherein each of the first insertion layer and the second insertion layer has a thickness within a range of 10 Angstroms to 15 Angstroms.

12. A magnetic recording device comprising the SOT device of claim 1.

13. A spin-orbit torque (SOT) device, comprising:
a first electrode;
a spin-orbit torque (SOT) layer that includes bismuth antimony (BiSb);
a cobalt-boron (CoB) layer, wherein the CoB layer is ferromagnetic;
a nano layer (NL) between the SOT layer and the CoB layer, wherein the NL is magnetic;
one or more insertion layers above the CoB layer such that the CoB layer is between the NL and the one or more insertion layers; and
a second electrode spaced from the first electrode.

14. The SOT device of claim 13, wherein the NL is formed of a magnetic material that includes one or more of cobalt (Co), nickel-iron (NiFe), cobalt-iron (CoFe), or a Heusler alloy.

15. The SOT device of claim 14, wherein the magnetic material of the NL includes $Co_2FeGe$.

16. The SOT device of claim 13, wherein the CoB layer has a resistivity that is at least 100 μOhms-cm.

17. The SOT device of claim 13, further comprising:
a seed layer;
a cap layer spaced from the seed layer, wherein the cap layer is nonmagnetic; and
a buffer layer between the seed layer and the SOT layer, wherein each of the SOT layer, the NL, the CoB layer, and the one or more insertion layers is between the buffer layer and the cap layer.

18. The SOT device of claim 17, further comprising:
wherein each of the seed layer, the cap layer, and the buffer layer is between the first electrode and the second electrode.

19. A magnetic recording device comprising the SOT device of claim 13.

20. A spin-orbit torque (SOT) device, comprising:
a first electrode;
a seed layer disposed over the first electrode;

a cap layer spaced from the seed layer, wherein the cap layer is nonmagnetic;
a spin Hall layer between the seed layer and the cap layer;
a polarizing means between the seed layer and the cap layer, wherein the polarizing means is magnetic;
a cobalt-boron (CoB) layer between the polarizing means and the cap layer, wherein the CoB layer is ferromagnetic, wherein there is spin orbital coupling between the CoB layer and the spin Hall layer;
one or more insertion layers between the CoB layer and the cap layer; and
a second electrode disposed over the cap layer.

* * * * *